(12) United States Patent
Ju

(10) Patent No.: US 9,882,296 B1
(45) Date of Patent: Jan. 30, 2018

(54) ELECTRICAL CONNECTOR

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/602,549

(22) Filed: May 23, 2017

(30) Foreign Application Priority Data

Dec. 20, 2016 (CN) .................. 2016 2 1399771 U

(51) Int. Cl.
*H01R 12/70* (2011.01)
*H01R 13/24* (2006.01)
*H01R 13/432* (2006.01)

(52) U.S. Cl.
CPC ..... *H01R 12/7076* (2013.01); *H01R 13/2435* (2013.01); *H01R 13/432* (2013.01)

(58) Field of Classification Search
CPC ............ H01R 12/7076; H01R 13/2435; H01R 13/432
USPC .................................................. 439/658, 66
See application file for complete search history.

(56) References Cited

U.S. PATENT DOCUMENTS

| | | | | |
|---|---|---|---|---|
| 6,315,576 B1 * | 11/2001 | Neidich | ............. | H01R 13/2435 439/591 |
| 6,869,290 B2 * | 3/2005 | Brown | .................... | H01L 24/72 257/E23.078 |
| 6,921,270 B2 * | 7/2005 | Mendenhall | ....... | H01R 13/2435 439/66 |
| 7,297,003 B2 * | 11/2007 | Rathburn | ............... | H01R 12/57 439/591 |
| 7,455,556 B2 * | 11/2008 | Mendenhall | ........... | H01R 12/57 439/495 |
| 7,597,561 B2 * | 10/2009 | Radza | ..................... | H01L 24/72 439/66 |
| 7,625,216 B2 * | 12/2009 | Mendenhall | ....... | H01R 13/2435 439/66 |
| 8,177,561 B2 * | 5/2012 | Ouchi | ................ | H01R 13/2485 174/260 |
| 8,786,301 B1 * | 7/2014 | Wright | ............... | G01R 31/2889 324/754.03 |

(Continued)

FOREIGN PATENT DOCUMENTS

| | | | |
|---|---|---|---|
| CN | 2618321 Y | 5/2004 |
| CN | 2706906 Y | 6/2005 |

*Primary Examiner* — Alexander Gilman
(74) *Attorney, Agent, or Firm* — Locke Lord LLP; Tim Tingkang Xia, Esq.

(57) ABSTRACT

An electrical connector includes an insulating body having multiple receiving holes, and multiple conductive terminals respectively received in the receiving holes. Each conductive terminal has first and second elastic arms, and third and fourth elastic arms. When a chip module downwardly presses the conductive terminals, the first elastic arm are conducted upwardly with the chip module, and the third elastic arm are conducted downwardly with a circuit board. At the same time, the first elastic arm elastically deform to urge against the second elastic arm, and the third elastic arm elastically deform to urge against the fourth elastic arm, thereby forming two conductive paths to reduce terminal impedance, and improving signal transmission performance. Further, the second elastic arm provide elastic force for the first elastic arm and the fourth elastic arm provide elastic force for the third elastic arm.

18 Claims, 6 Drawing Sheets

(56) References Cited

U.S. PATENT DOCUMENTS

| | | | |
|---|---|---|---|
| 8,821,198 B2* | 9/2014 | Harada | H01R 12/57 |
| | | | 439/66 |
| 8,926,338 B2* | 1/2015 | Kiryu | H01R 13/24 |
| | | | 439/66 |
| 9,203,172 B2* | 12/2015 | Kubo | H01R 12/73 |
| 9,425,525 B2* | 8/2016 | Walden | H01R 12/7082 |
| 9,680,273 B2* | 6/2017 | Light | H01R 43/16 |

* cited by examiner

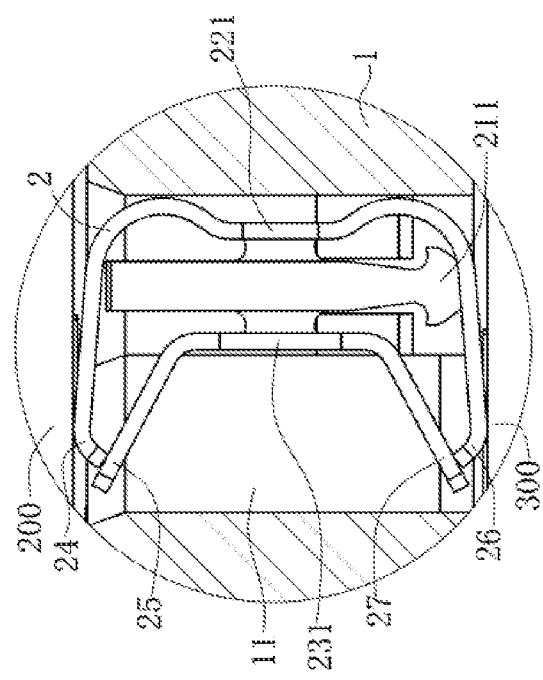

ELECTRICAL CONNECTOR

CROSS-REFERENCE TO RELATED APPLICATIONS

This non-provisional application claims priority to and benefit of, under 35 U.S.C. § 119(a), Patent Application No. 201621399771.3 filed in P.R. China on Dec. 20, 2016, the entire content of which is hereby incorporated by reference.

FIELD OF THE INVENTION

The present invention relates to an electrical connector, and more particularly to a Land grid array electrical connector which is used for connecting a chip module to a circuit board.

BACKGROUND OF THE INVENTION

A Land grid array electrical connector is normally located between a chip module and a circuit board. Terminals of the electrical connector are electrically conducted with the chip module and the circuit board in a pressing manner. The chip module and the circuit board are provided respectively with conductive sheets which are pressed by the terminals. Because of the structural characteristics of a Land grid array, the terminals of the electrical connector normally have to have good elasticity, which enables the terminals to deform elastically, so that the terminals of the electrical connector can be conducted with the chip module and the circuit board in an elastic pressing manner, and thereby the reliable electrical connection between the chip module and the circuit board can be realized. Further, the terminals also have to have enough pressure resistance to prevent the elasticity of the terminals from decreasing due to long-term pressure.

In order for terminals to have good elasticity, a conventional Land grid array electrical connector terminal, as disclosed in U.S. Pat. No. 6,315,576, is normally provided with a long first elastic suspending arm and a long second elastic suspending arm, and first conductive portions and second conductive portions are arranged respectively at the ends of the suspending arms in order to be respectively in electrical contact with conductive sheets of a chip module and a circuit board. However, since the conductive portions of the electrical connector terminals are located at the ends of the long suspending arms, after the chip module is electrically conducted with the circuit board, a long conductive path which is formed sequentially by the conductive sheet of the chip module, the first conductive portion, the first elastic suspending arm, the second elastic suspending arm and the second conductive portion of the electrical connector terminal and the conductive sheet of the circuit board is formed between the chip module and the circuit board, as a result, the self-inductance effect of the conductive path is great, and moreover, when current flows through the long conductive path, total electrical impedance increases. Since current electrical signal transmission generally has high frequency and will generate a greater self-inductance effect, the normal function of a circuit will be affected due to increases in self-inductance effect and electrical impedance, and thereby the electrical connection between the chip module and the circuit board and signal transmission performance will be affected. Moreover, because the first elastic suspending arm and the second elastic suspending arm are under pressure for a long time, the first elastic suspending arm and the second elastic suspending arm may affect electrical conductivity due to decrease in elasticity.

An existing conductive terminal for socket connectors, as disclosed in a Chinese patent No. 03239559.0, which has solved the above-mentioned technical problems is provided with a mounting portion and an extending portion arranged by extending from one side of a body. The extending portion is U-shaped, and is provided with a first extending portion, a first contacting portion, a second extending portion and a second contacting portion in sequence. The conductive terminal is received in a terminal hole of the insulating body, and the first contacting portion and the second contacting portion respectively protrude and extend out of the two opposite surfaces of the insulating body. When a socket connector is connected with a chip module and a circuit board, each conductive terminal of the socket connector deforms elastically due to pressure applied by the chip module and the circuit board, so that the free end of the second contacting portion moves toward the mounting portion to be in contact with the mounting portion, and thereby a first conductive path, which is formed sequentially by a conductive pad of the chip module, the second contacting portion, the second extending portion, the first contacting portion and a corresponding conductive pad of the circuit board, and a second conductive path, which is formed sequentially by the conductive pad of the chip module, the second contacting portion, the mounting portion, the first extending portion, the first contacting portion and the corresponding conductive pad of the circuit board, are formed. Because the first conductive path and the second conductive path are in a parallel relation, the total impedance value is decreased, consequently, the heat produced by the conductive terminal is reduced during electrical signal transmission, and thereby good electrical conductivity can be provided between the chip module and the circuit board.

However, such a conductive terminal for socket connectors at least has the following disadvantages: since the conductive terminal receives pressure to deform elastically, only after the free end of the second contacting portion is in stable contact with the mounting portion can the second conductive path be formed, and therefore the press-fitting size of the conductive terminal is required to be accurate; if the pressure is too high, it will cause the second contacting portion to deform plastically; if the pressure is not enough, then it will cause the free end of the second contacting portion to be in unstable contact with the mounting portion; as a result, the second conductive path cannot be formed stably, and good electrical conduction cannot be realized between the chip module and the circuit board.

Therefore, a heretofore unaddressed need exists in the art to address the aforementioned deficiencies and inadequacies.

SUMMARY OF THE INVENTION

In one aspect, the present invention relates to an electrical connector, terminals of which can form two conductive paths to reduce terminal impedance, and can also guarantee the stable conduction of the two conductive paths, thus providing good electrical conductivity between a chip module and a circuit board.

In certain embodiments, an electrical connector includes an insulating body provided with multiple receiving holes, and multiple conductive terminals respectively received correspondingly in the receiving holes. Each conductive terminal has a plate portion along the vertical direction. A first connecting portion and a second connecting portion are formed by respectively bending and extending from the front side and the rear side of the plate portion. The first connecting portion and the second connecting portion are located on the same side of the vertical plane where the plate portion is positioned. A first elastic arm and a second elastic arm are formed by respectively bending upward and extending from the top of the first connecting portion and the top of the second connecting portion. The first elastic arm is used for upwardly urging against a chip module. A third elastic arm and a fourth elastic arm are formed by respectively bending downward and extending from the bottom of the first connecting portion and the bottom of the second connecting portion. The third elastic arm is used for downwardly urging against a circuit board. The first elastic arm, the second elastic arm, the third elastic arm and the fourth elastic arm all extend forward to go beyond the second connecting portions. When the chip module downwardly presses the first elastic arm, the ends of the first elastic arm urge against the second elastic arm, and the ends of the third elastic arm urge against the fourth elastic arm.

In certain embodiments, the first elastic arm first bends backward, then bends forward and upward and extends from the first connecting portion, and the third elastic arm first bends backward, then bends forward and downward and extends from the first connecting portion.

In certain embodiments, when the end of the first elastic arm urges against the second elastic arm and the end of the third elastic arm urges against the fourth elastic arm, the end of the second elastic arm is higher than the end of the first elastic arm, and the end of the fourth elastic arm is lower than the end of the third elastic arm.

In certain embodiments, along the vertical direction, the length of the first connecting portion is less than the length of the second connecting portion.

In certain embodiments, one side of the first connecting portion and one side of the second connecting portion are respectively and convexly provided with a first protruding portion and a second protruding portion, the bottom of the first protruding portion is higher than the bottom of the second protruding portion, a first side surface of each receiving hole is provided with a first limiting portion located under the first protruding portion and a second limiting portion located under the second protruding portion to limit the downward motion of the conductive terminal, and the first limiting portion is higher than the second limiting portion.

In certain embodiments, the first connecting portion and the second connecting portion are flat respectively and are perpendicular to the plate portion, and a barb is formed at the end of the plate portion.

In another aspect, the present invention relates to an electrical connector. In certain embodiments, an electrical connector includes an insulating body provided with multiple receiving holes, and multiple conductive terminals respectively received correspondingly in the receiving holes. Each conductive terminal has a main body. A first elastic arm and a second elastic arm are formed by bending upward and extending from the main body. The first elastic arm is used for upwardly urging against a chip module. A third elastic arm and a fourth elastic arm are formed by bending downward and extending from the main body. The third elastic arm is used for downwardly urging against a circuit board. When the chip module downwardly presses the first elastic arm, the first elastic arm urge against the second elastic arm, and the third elastic arm urge against the fourth elastic arm.

In certain embodiments, the first elastic arm has a curved first contacting portion that upwardly urges against the chip module, and the third elastic arm has a curved mating portion that downwardly urges against the circuit board. When the chip module urges against the contacting portions, the ends of the contacting portions urge against the second elastic arms, and the ends of the mating portions urge against the fourth elastic arms.

In certain embodiments, when the ends of the contacting portions urge against the second elastic arms, and the ends of the mating portions urge against the fourth elastic arms, ends of the second elastic arms is higher than ends of the contacting portions, and ends of the fourth elastic arms is lower than end of the mating portions.

In certain embodiments, the main body has a plate portion, and a first connecting portion and a second connecting portion formed by bending and extending from the two opposite sides of the plate portion. The first elastic arm extends upward from the top of the first connecting portion, and the second elastic arm extends upward from the top of the second connecting portion. The length of the first elastic arm is greater than the length of the second elastic arm. The third elastic arm extends downward from the bottom of the first connecting portion, and the fourth elastic arm extends downward from the bottom of the second connecting portion. The length of the third elastic arm is greater than the length of the fourth elastic arm.

In certain embodiments, the top of the first connecting portion is lower than the top of the second connecting portion, and the bottom of the first connecting portion is higher than the bottom of the second connecting portion.

In certain embodiments, one side of the first connecting portion and one side of the second connecting portion are respectively and convexly provided with a first protruding portion and a second protruding portion, and a first side surface of each receiving hole is provided with a first limiting portion located under the first protruding portion and a second limiting portion located under the second protruding portion to limit the downward motion of the conductive terminal. A second side surface, opposite to the first side surface, of each receiving hole is convexly provided with two protruding blocks respectively on the front side and rear side of the plate portion, and the front side and the rear side of the end of the plate portion are respectively provided with a barb located under the protruding block to limit the upward motion of the conductive terminal.

In certain embodiments, the first elastic arm first extends to a direction far away from the vertical plane where the first connecting portion is positioned from the first connecting portion, then returns, bends and extends to pass through the vertical plane where the first connecting portion is positioned.

In certain embodiments, the third elastic arm first extends to a direction far away from the vertical plane where the first connecting portion is positioned from the first connecting portion, then returns, bends and extends to pass through the vertical plane where the first connecting portion is positioned.

In certain embodiments, the first elastic arm extends to pass through the vertical plane where the second connecting portion is positioned.

In certain embodiments, the third elastic arm extends to pass through the vertical plane where the second connecting portion is positioned.

In certain embodiments, the first connecting portion and the second connecting portion are flat respectively and are perpendicular to the plate portion, and a barb is formed at an end of the plate portion.

In certain embodiments, the second elastic arm extends from the second connecting portion toward a direction away from a vertical plane where the first connecting portion is positioned.

Compared with the related art, the invention has the following beneficial advantages.

Since each conductive terminal of the electrical connector is provided with the first elastic arm and the second elastic arm and is provided with the third elastic arm and the fourth elastic arm, when the chip module downwardly presses the conductive terminals, the first elastic arms are conducted upwardly with the chip module, the third elastic arms are conducted downwardly with the circuit board, at the same time, the first elastic arms deform elastically to urge against the second elastic arms, and the third elastic arms deform elastically to urge against the fourth elastic arms, thereby forming the two conductive paths to reduce terminal impedance, and improving signal transmission performance. Further, the second elastic arms provide elastic force for the first elastic arms and the fourth elastic arms provide elastic force for the third elastic arms, so that the first elastic arms and the second elastic arms respectively press the chip module and the circuit board, and therefore the stable electrical connection between the conductive terminals and both of the chip module and the circuit board can be realized reliably, thereby guaranteeing the good electrical conduction between the chip module and the circuit board.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 5B is an enlarged view of a part that is highlighted by a circle a in FIG. 5A.

DETAILED DESCRIPTION OF THE INVENTION

Figure 1:
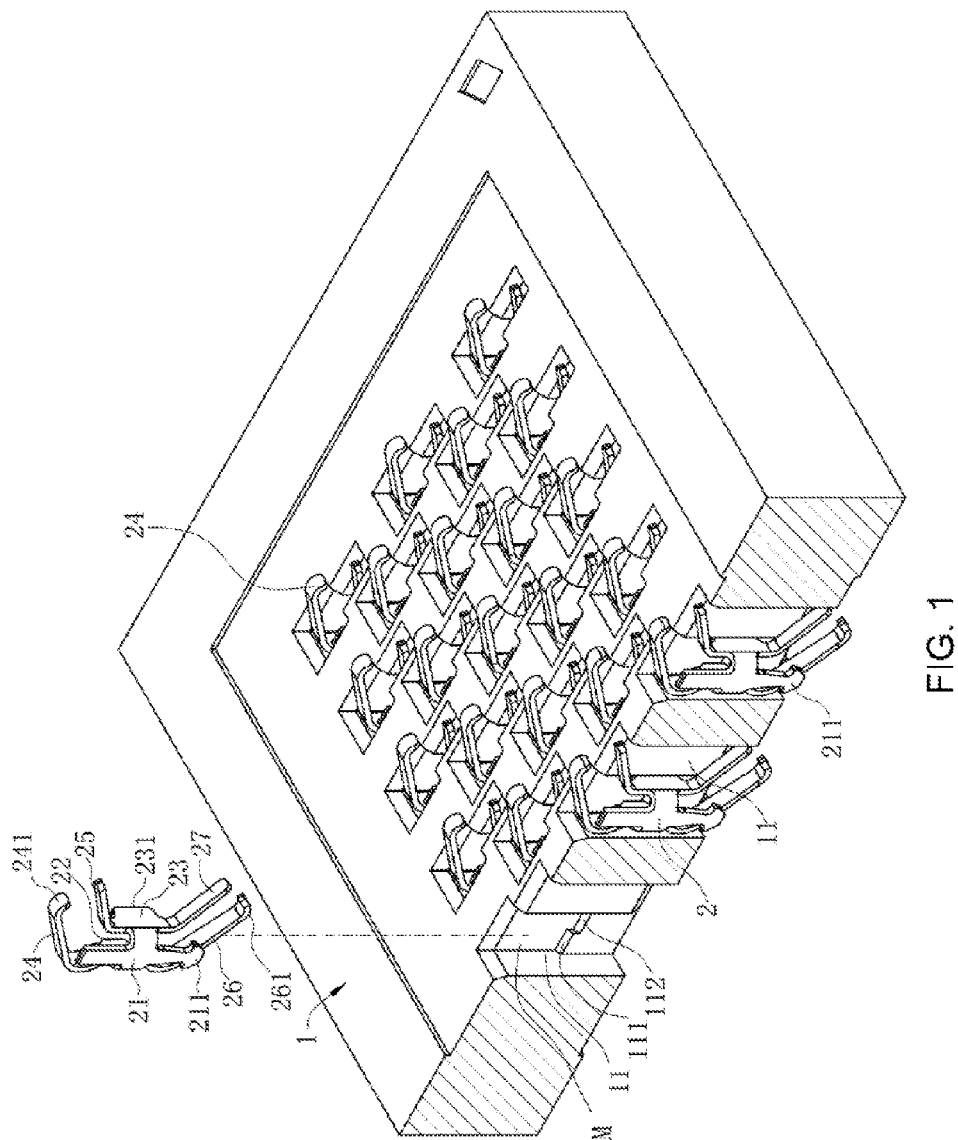
FIG. 1 is a schematic three-dimensional sectional view of an electrical connector according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-5B. In accordance with the purposes of this invention, as embodied and broadly described herein, this invention, in one aspect, relates to an electrical connector.

As shown in FIG. 1 to FIG. 5B, an electrical connector 100 according to one embodiment of the present invention includes an insulating body 1 provided with multiple receiving holes 11 vertically running through the insulating body 1, and multiple conductive terminals 2 respectively received correspondingly in the receiving holes 11.

Figure 2:
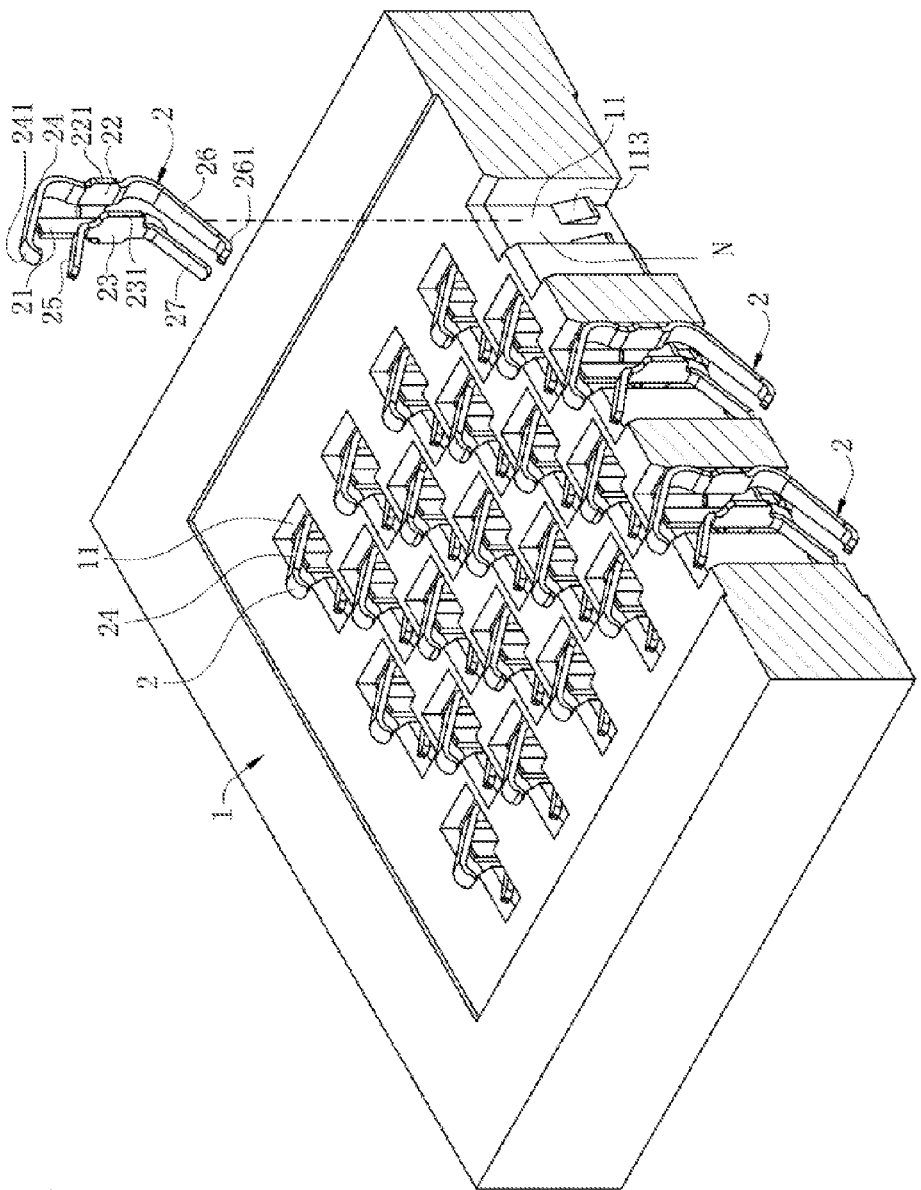
FIG. 2 is a schematic three-dimensional sectional view of the electrical connector according to one embodiment of the present invention in another direction.

As shown in FIG. 1 and FIG. 2, each receiving hole 11 has a first side surface M and an opposite, second side surface N. The first side surface M of each receiving hole 11 is provided with a first limiting portion 111 and a second limiting portion 112, and the first limiting portion 111 is higher than the second limiting portion 112. The second side surface N of the receiving hole 11 is provided with two protruding blocks 113.

Figure 3:
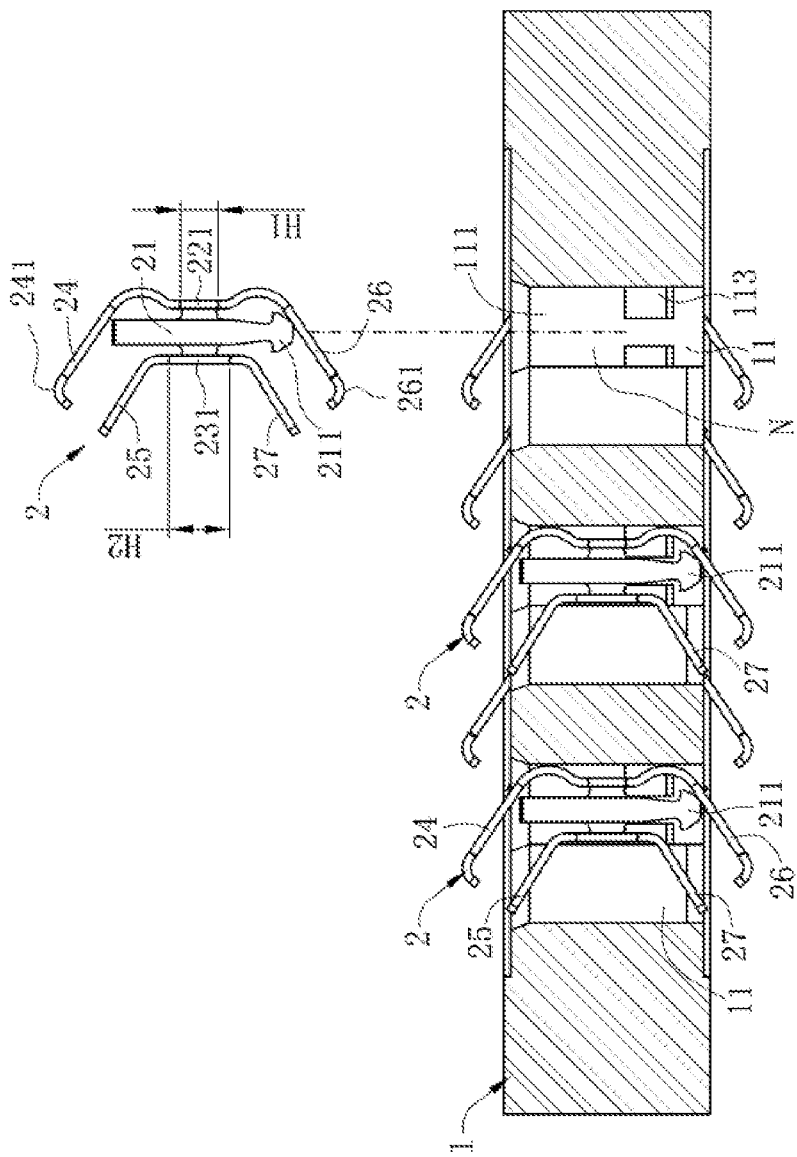
FIG. 3 is a planar sectional view of the electrical connector according to one embodiment of the present invention.

As shown in FIGS. 1-3, each conductive terminal 2 includes a main body (not labeled). The main body has a plate portion 21 along the vertical direction, and a first connecting portion 22 and a second connecting portion 23 formed by respectively bending perpendicularly to the plate portion 21 and extending from the front side and the rear side of the plate portion 21. In other embodiments, the plate portion 21, the first connecting portion 22 and the second connecting portion 23 can also be formed separately and assembled together. The upper end of the plate portion 21 is used for connecting with a material strip (not shown), and the front side and the rear side of the lower end of the plate portion 21 are each provided with a barb 211. The first connecting portion 22 and the second connecting portion 23 are located on the same side of the vertical plane where the plate portion 21 is positioned. Along the vertical direction, the length H1 of the first connecting portion 22 is less than the length H2 of the second connecting portion 23.

As shown in FIGS. 2 and 3, one side of the first connecting portion 22 and one side of the second connecting portion 23 are respectively protruded with a first protruding portion 221 and a second protruding portion 231. The bottom of the first protruding portion 221 is higher than the bottom of the second protruding portion 231, and the top of the first protruding portion 221 is lower than the top of the second protruding portion 231.

As shown in FIGS. 1 and 3, when the conductive terminals 2 are inserted into the receiving holes 11, the first limiting portions 111 and the second limiting portions 112 are respectively located under the first protruding portions 221 and the second protruding portions 231 to limit the downward motion of the conductive terminals 2. Further, the first protruding portion 221 and the second protruding portion 231 are located on the right side (inner side) of the first side surface M, the plate portion 21 is located on the left side (inner side) of the second side surface N, and thereby the left-right motion of the conductive terminals 2 are limited. The two protruding blocks 113 are located on the front side and the rear side of the plate portion 21, so that the front-rear motion of the conductive terminals 2 is limited. The barbs 211 are located under the protruding blocks 113 to limit the upward motion of the conductive terminals 2. Thus the conductive terminals 2 are retained in the insulating body 1 securely.

Figure 4:
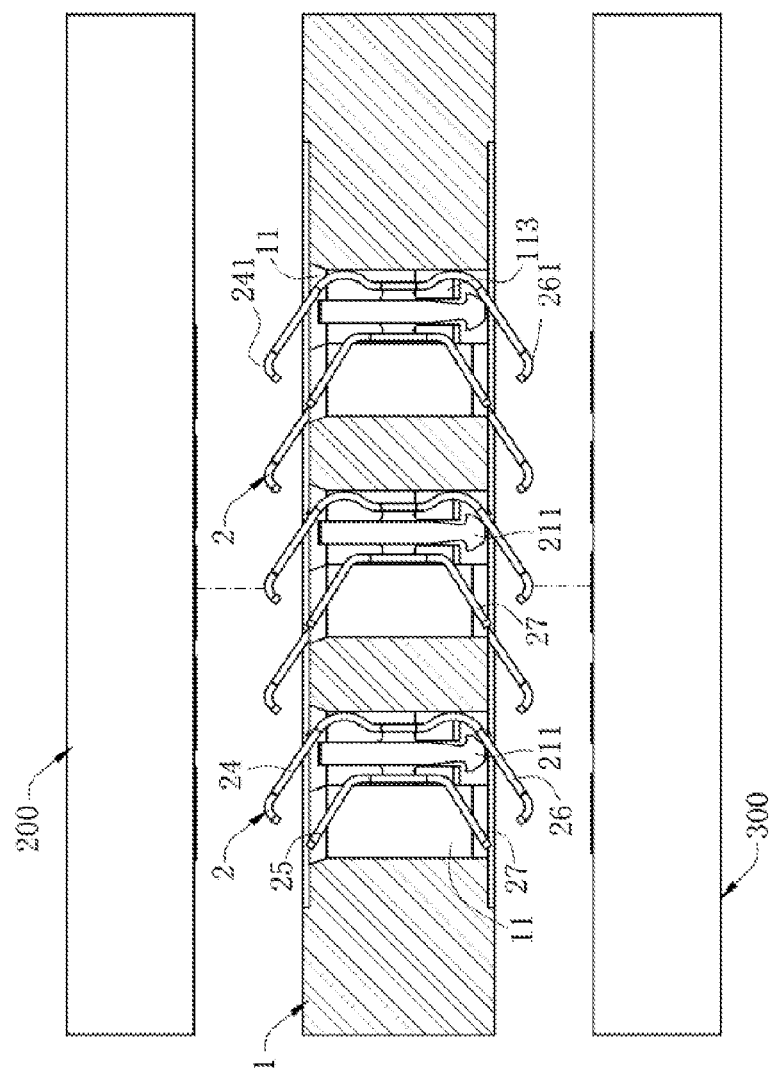
FIG. 4 is a planar sectional view when the electrical connector according to one embodiment of the present invention is located between a chip module and a circuit board and the chip module is not pressed downward.

As shown in FIGS. 2-4, a first elastic arm 24 and a second elastic arm 25 are formed by respectively bending upward and extending from the top of the first connecting portion 22 and the top of the second connecting portion 23. The length of the first elastic arm 24 is greater than the length of the second elastic arm 25. The first elastic arm 24 is provided with a curved contacting portion 241 which is used for upwardly urging against a chip module 200. A third elastic arm 26 and a fourth elastic arm 27 are formed by respectively bending downward and extending from the bottom of the first connecting portion 22 and the bottom of the second connecting portion 23. The length of the third elastic arm 26 is greater than the length of the fourth elastic arm 27. The third elastic arm 26 is provided with a curved mating portion 261 which is used for downwardly urging against a circuit board 300. The first elastic arm 24, the second elastic arm 25, the third elastic arm 26 and the fourth elastic arm 27 all extend forward to go beyond the second connecting portion 23.

As shown in FIG. 3, the first elastic arm 24 first bends backward from the first connecting portion 22, then bends forward and upward and extends, and the third elastic arm 26 first bends backward from the first connecting portion 22, then bends forward and downward and extends. By bending backward, the lengths of the first elastic arm 24 and the third elastic arm 26 are increased, the elasticity of the first elastic arm 24 and the third elastic arm 26 are increased, and thereby the reliable connection between the chip module 200 and the circuit board 300 is guaranteed.

Figure 5A:
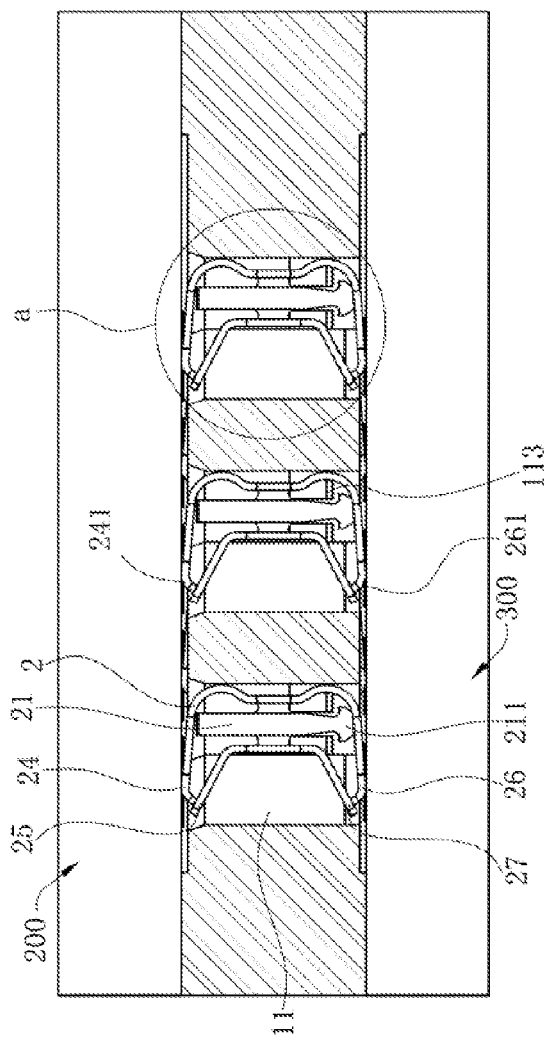
FIG. 5A is a planar sectional view when the electrical connector according to one embodiment of the present invention is located between a chip module and a circuit board and the chip module is pressed downward.

As shown in FIGS. 5A and 5B, when the chip module 200 is assembled on the insulating body 1, the chip module 200 downwardly presses the contacting portions 241. The first elastic arms 24 deform elastically while the ends urge against the second elastic arms 25, and the third elastic arms 26 deform elastically while the ends urge against the fourth elastic arms 27. The ends of the second elastic arms 25 are higher than the ends of the first elastic arms 24, and the ends of the fourth elastic arms 27 are lower than the ends of the third elastic arms 26. At this moment, a first conductive path, which is formed sequentially by a conductive pad of the chip module 200, the contacting portions 241, the first connecting portions 22, the mating portions 261 and a corresponding conductive pad of the circuit board 300, and a second conductive path, which is formed sequentially by the conductive pad of the chip module 200, the contacting portions 241, the second elastic arms 25, the fourth elastic arms 27, the mating portions 261 and the corresponding conductive pad of the circuit board 300, are formed. Because the first conductive path and the second conductive path are in a parallel relation, the total impedance value is decreased.

In summary, the electrical connector 100 according to certain embodiments of the present invention has the following beneficial advantages.

(1) Since each conductive terminal 2 is provided with the first elastic arm 24 and the third elastic arm 26 and is provided with the second elastic arm 25 and the fourth elastic arm 27, when the chip module 200 downwardly presses the conductive terminals 2, the first elastic arms 24 are conducted upwardly with the chip module 200, the third elastic arms 26 are conducted downwardly with the circuit board 300, at the same time, the first elastic arms 24 deform elastically to urge against the second elastic arms 25, and the third elastic arms 26 deform elastically to urge against the fourth elastic arms 27, thereby forming the two conductive paths to reduce terminal impedance, and improving signal transmission performance. Further, the second elastic arms 25 provide elastic force for the first elastic arms 24 and the fourth elastic arms 27 provide elastic force for the third elastic arms 26, so that the first elastic arms 24 and the third elastic arm 26 respectively press the chip module 200 and the circuit board 300, so the stable electrical connection between the conductive terminals 2 and both of the chip module 200 and the circuit board 300 can be realized reliably, guaranteeing the good electrical conduction between the chip module 200 and the circuit board 300.

(2) As compared with first elastic arms and second elastic arms bending backward to form contactable first short arms and second short arms to form two conductive paths disclosed by Chinese patent No. 200420026548.5, the first elastic arms 24 and the third elastic arms 26 of the conductive terminals of the present invention do not need to bend backward, and thereby the conductive terminals 2 can be formed easily.

(3) When the ends of the first elastic arms 24 urge against the second elastic arms 25 and the ends of the third elastic arms 26 urge against the fourth elastic arms 27, the ends of the second elastic arms 25 are higher than the ends of the first elastic arms 24, the ends of the fourth elastic arms 27 are lower than the ends of the third elastic arms 26, and thereby it is ensured that the first elastic arms 24 can sufficiently urge against the second elastic arms 25 and that the third elastic arms 26 can sufficiently urge against the fourth elastic arms 27.

(4) Along the vertical direction, the length of the first connecting portions 22 is less than the length of the second connecting portions 23, and thereby the lengths of the first elastic arms 24 and the third elastic arms 26 can be increased. Further, by increasing the length of the second connecting portions 23 in the vertical direction, the immobilization effect of the conductive terminals 2 in the receiving holes 11 is enhanced.

(5) One side of each first connecting portion 22 is provided with the first protruding portion 221, and one side of each second connecting portion 23 is provided with the second protruding portion 231. The first protruding portion 221 and the second protruding portion 231 limit the deflection of the first elastic arm 24, the second elastic arm 25, the third elastic arm 26 and the fourth elastic arm 27 along the left-right direction, and thereby the stability of contact between the first elastic arm 24 and the second elastic arm 25 or the chip module 200 and the stability of contact between the third elastic arm 26 and the fourth elastic arm 27 or the circuit board 300 are guaranteed.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
   an insulating body provided with a plurality of receiving holes; and
   a plurality of conductive terminals respectively received in the receiving holes, wherein each of the conductive terminals comprises:
   a plate portion along a vertical direction;
   a first connecting portion and a second connecting portion formed by respectively bending and extending from a front side and a rear side of the plate portion, the first connecting portion and the second connecting portion located on a same side of a vertical plane where the plate portion is positioned;
   a first elastic arm and a second elastic arm formed by respectively bending upward and extending from a top of the first connecting portion and a top of the second connecting portion, the first elastic arm being used for upwardly urging against a chip module; and
   a third elastic arm and a fourth elastic arm formed by respectively bending downward and extending from a bottom of the first connecting portion and a bottom of the second connecting portion, the third elastic arm being used for downwardly urging against a circuit board,
   wherein the first elastic arm, the second elastic arm, the third elastic arm and the fourth elastic arm all extend forward to go beyond the second connecting portion, and when the chip module downwardly presses the first elastic arm, an end of the first elastic arm urge against the second elastic arm, and an end of the third elastic arm urge against the fourth elastic arm.

2. The electrical connector of claim 1, wherein the first elastic arm first bends backward, then bends forward and upward and extends from the first connecting portion, and the third elastic arm first bends backward, then bends forward and downward and extends from the first connecting portion.

3. The electrical connector of claim 1, wherein when the end of the first elastic arm urges against the second elastic arm and the end of the third elastic arm urges against the fourth elastic arm, an end of the second elastic arm is higher than the end of the first elastic arm, and an end of the fourth elastic arm is lower than the end of the third elastic arm.

4. The electrical connector of claim 1, wherein along the vertical direction, a length of the first connecting portion is less than a length of the second connecting portion.

5. The electrical connector of claim 1,
   wherein one side of the first connecting portion and one side of the second connecting portion are respectively protruded with a first protruding portion and a second protruding portion, and a bottom of the first protruding portion is higher than a bottom of the second protruding portion;
   wherein a first side surface of each receiving hole is provided with a first limiting portion and a second limiting portion, and the first limiting portion is higher than the second limiting portion; and
   wherein the first limiting portion is located under the first protruding portion and the second limiting portion is located under the second protruding portion to limit downward motion of the conductive terminal.

6. The electrical connector of claim 1, wherein the first connecting portion and the second connecting portion are flat respectively and are perpendicular to the plate portion, and a barb is formed at an end of the plate portion.

7. An electrical connector, comprising:
   an insulating body provided with a plurality of receiving holes; and
   a plurality of conductive terminals respectively received correspondingly in the receiving holes, wherein each of the conductive terminals comprises:
   a main body;
   a first elastic arm and a second elastic arm formed by bending upward and extending from the main body, the first elastic arm being used for upwardly urging against a chip module; and
   a third elastic arm and a fourth elastic arm are formed by bending downward and extending from the main body, the third elastic arm being used for downwardly urging against a circuit board,
   wherein when the chip module downwardly presses the first elastic arm, the first elastic arm urge against the second elastic arm, and the third elastic arm urge against the fourth elastic arm.

8. The electrical connector of claim 7, wherein the first elastic arm is provided with a curved first contacting portion that upwardly urges against the chip module, and the third elastic arm is provided with a curved mating portion that downwardly urges against the circuit board, and when the chip module urges against the contacting portions, ends of the contacting portions urge against the second elastic arms, and ends of the mating portions urge against the fourth elastic arms.

9. The electrical connector of claim 8, wherein when the ends of the contacting portions urge against the second elastic arms, and the ends of the mating portions urge against the fourth elastic arms, ends of the second elastic arms is higher than ends of the contacting portions, and ends of the fourth elastic arms is lower than end of the mating portions.

10. The electrical connector of claim 7,
wherein the main body comprises a plate portion, and a first connecting portion and a second connecting portion formed by bending and extending from two opposite sides of the plate portion;
wherein the first elastic arm extends upward from a top of the first connecting portion, the second elastic arm extends upward from a top of the second connecting portion, and a length of the first elastic arm is greater than a length of the second elastic arm; and
wherein the third elastic arm extends downward from a bottom of the first connecting portion, the fourth elastic arm extends downward from a bottom of the second connecting portion, and a length of the third elastic arm is greater than a length of the fourth elastic arm.

11. The electrical connector of claim 10, wherein the top of the first connecting portion is lower than the top of the second connecting portion, and the bottom of the first connecting portion is higher than the bottom of the second connecting portion.

12. The electrical connector of claim 10,
wherein one side of the first connecting portion and one side of the second connecting portion are respectively protruded with a first protruding portion and a second protruding portion, and a first side surface of each receiving hole is provided with a first limiting portion located under the first protruding portion and a second limiting portion located under the second protruding portion to limit the downward motion of the conductive terminal; and
wherein a second side surface, opposite to the first side surface, of each receiving hole is protruded with two protruding blocks respectively on a front side and a rear side of the plate portion, and a front side and a rear side of the end of the plate portion are provided respectively with a barb located under the protruding block to limit the upward motion of the conductive terminal.

13. The electrical connector of claim 10, wherein the first elastic arm first extends from the first connecting portion toward a direction away from a vertical plane where the first connecting portion is positioned, then returns, bends and extends to pass through the vertical plane where the first connecting portion is positioned.

14. The electrical connector of claim 10, wherein the third elastic arm first extends from the first connecting portion toward a direction away from a vertical plane where the first connecting portion is positioned, then returns, bends and extends to pass through the vertical plane where the first connecting portion is positioned.

15. The electrical connector of claim 10, wherein the first elastic arm extends to pass through the vertical plane where the second connecting portion is positioned.

16. The electrical connector of claim 10, wherein the third elastic arm extends to pass through the vertical plane where the second connecting portion is positioned.

17. The electrical connector of claim 10, wherein the first connecting portion and the second connecting portion are flat respectively and are perpendicular to the plate portion, and a barb is formed at an end of the plate portion.

18. The electrical connector of claim 10, wherein the second elastic arm extends from the second connecting portion toward a direction away from a vertical plane where the first connecting portion is positioned.

* * * * *